United States Patent [19]
Saito

[11] Patent Number: 5,475,243
[45] Date of Patent: Dec. 12, 1995

[54] SEMICONDUCTOR DEVICE INCLUDING AN IGBT AND A CURRENT-REGENERATIVE DIODE

[75] Inventor: Ryu Saito, Matsumoto, Japan

[73] Assignee: Fuji Electric Co., Ltd., Kawasaki, Japan

[21] Appl. No.: 199,981

[22] Filed: Feb. 22, 1994

Related U.S. Application Data

[63] Continuation of Ser. No. 906,567, Jun. 30, 1992, abandoned.

[30] Foreign Application Priority Data

Jul. 2, 1991 [JP] Japan .................................. 3-160708
Jul. 8, 1991 [JP] Japan .................................. 3-166043

[51] Int. Cl.⁶ .................. H01L 23/48; H01L 29/744; H01L 29/747
[52] U.S. Cl. .................. 257/171; 257/110; 257/112; 257/121; 257/124; 257/127; 257/146; 257/494; 257/577; 257/586; 257/587; 257/618; 257/622
[58] Field of Search .................. 257/121, 124, 257/125, 127, 129, 133, 137, 138, 143, 144, 145, 146, 147, 148, 149, 152, 153, 161, 168, 170, 171, 172, 173, 174, 176, 181, 477, 479, 483, 484, 49, 494, 495, 496, 497, 498, 577, 586, 587, 605, 107, 139, 108, 109, 110, 111, 112, 113, 114, 115, 116, 117, 118, 119, 120, 122, 618, 619, 620, 621, 622, 623, 625, 626

[56] References Cited

U.S. PATENT DOCUMENTS

| | | | |
|---|---|---|---|
| 3,697,829 | 10/1972 | Huth et al. .......................... | 257/171 |
| 3,893,153 | 7/1975 | Page et al. .......................... | 257/115 |
| 4,032,364 | 6/1979 | Anthony et al. .................... | 257/110 |
| 4,109,274 | 8/1978 | Belenkov et al. .................. | 257/110 |
| 4,636,830 | 1/1987 | Bhagat ................................ | 257/170 |
| 4,672,407 | 6/1987 | Nakagawa et al. ................ | 257/144 |
| 4,841,345 | 6/1989 | Majumdar .......................... | 257/143 |

FOREIGN PATENT DOCUMENTS

| | | | |
|---|---|---|---|
| 0450082 | 10/1991 | European Pat. Off. . | |
| 9103842 | 3/1991 | WIPO ............................... | 257/139 |

OTHER PUBLICATIONS

"Speeding Up the Built-in Diode of a Collector-Short-Circuit Type IGBT by Irradiating Protons" 463 The Institute of Electrical Engineers of Japan (Apr. 1991) No figures are provided.

*Primary Examiner*—Sara W. Crane
*Assistant Examiner*—Alice W. Tang
*Attorney, Agent, or Firm*—Brumbaugh, Graves, Donohue & Raymond

[57] ABSTRACT

An insulated-gate bipolar transistor (IGBT) is connected in reverse-parallel with a current-regenerative diode which, for economy of manufacture, is integrated with the IGBT. Such a diode may extend laterally on an IGBT chip, with two conductivity regions forming the diode respectively connected to emitter and collector electrodes of the IGBT. Alternatively, the diode may be formed by short-circuiting a buffer layer and a collector layer. By such integration, greater device packing density can be realized.

4 Claims, 6 Drawing Sheets

SEMICONDUCTOR DEVICE INCLUDING AN IGBT AND A CURRENT-REGENERATIVE DIODE

This application is a continuation of application Ser. No. 07/906,567, filed on Jun. 30, 1992, now abandoned.

BACKGROUND OF THE INVENTION

The present invention relates to semiconductor devices and, more particularly, to an insulated-gate bipolar transistor (IGBT) with a current-regenerative diode.

In an inverter circuit, for example, a current-regenerative diode advantageously can be included to form a bypass which permits current flow when an inverse voltage is applied to the switching element in the circuit. As schematically shown in FIG. 4 for an exemplary IGBT switching element 31 with gate electrode G, collector electrode C and emitter electrode E, such a diode 32 is connected in reverse parallel to the switching element.

In the case of a vertical-MOS transistor switching element as shown in FIG. 2, a current-regenerative diode is readily integrated with the switching element. A $p^+$-region 23 and a $p^+$-channel region 22 are formed at the surface of an $n^-$-layer 21, with the $p^+$-region 23 and the $n^-$-layer 21 forming a p-n junction in a current-regenerative diode. An electrode 24 making contact with the $p^+$-region 23 serves as an anode for the current-regenerative diode, and a transistor drain electrode 26 making contact with an $n^+$-drain layer 25 below the $n^-$-layer 21 serves as a cathode. The electrode 24 and a transistor source electrode 27 are connected by a conductor 28.

In the case of an ordinary bipolar transistor, an integrated current-regenerative diode can be formed by a region of the collector layer and an additional region having the same conductivity type as the base region. On the other hand, in an IGBT with a structure as shown in FIG. 3, an optional buffer $n^+$-layer 2 cannot serve in forming a diode because of the $p^+$-collector layer 3 below the $n^-$-layer 1. Further shown in FIG. 3 are a channel $p^+$-region 4, an emitter $n^+$-region 5 formed at the surface of the channel region, a gate electrode 7 on a gate electrode insulating film 6 laterally extending over a portion of the channel $p^+$-region 4 between the emitter $n^+$-region 5 and the $n^-$-layer 1, an emitter electrode 8 contacting both the $p^+$-region 4 and the $n^+$-region 5, and a collector electrode 9 contacting the collector layer 3.

When, for such an IGBT, a current-regenerative diode is provided on a separate chip, over-all device dimensions are increased, and device manufacture is complicated by the need for additional interconnection and encapsulation.

SUMMARY OF THE INVENTION

The invention provides for integration of an IGBT and a current-regenerative diode. In a preferred embodiment, an IGBT is integrated with a laterally-extending current-regenerative diode in reverse-parallel connection with the IGBT. Such a diode includes a base layer of first conductivity type having a high specific resistance, a region of first conductivity type formed near the edge of the device at the surface of the base layer, and a region of second conductivity type having a specific resistance higher than the first region, formed away from the edge of the device at the surface of the base layer. The current-regenerative diode is electrically connected to the IGBT element as the region of second conductivity type is coupled to the IGBT emitter electrode, and the region of first conductivity type to the IGBT collector electrode.

Preferred alternatively, for reverse-parallel connection of an IGBT and a current-regenerative diode in an integrated device, is short-circuiting a buffer layer and a collector layer.

DETAILED DESCRIPTION OF PREFERRED EMBODIMENTS

Figure 1:
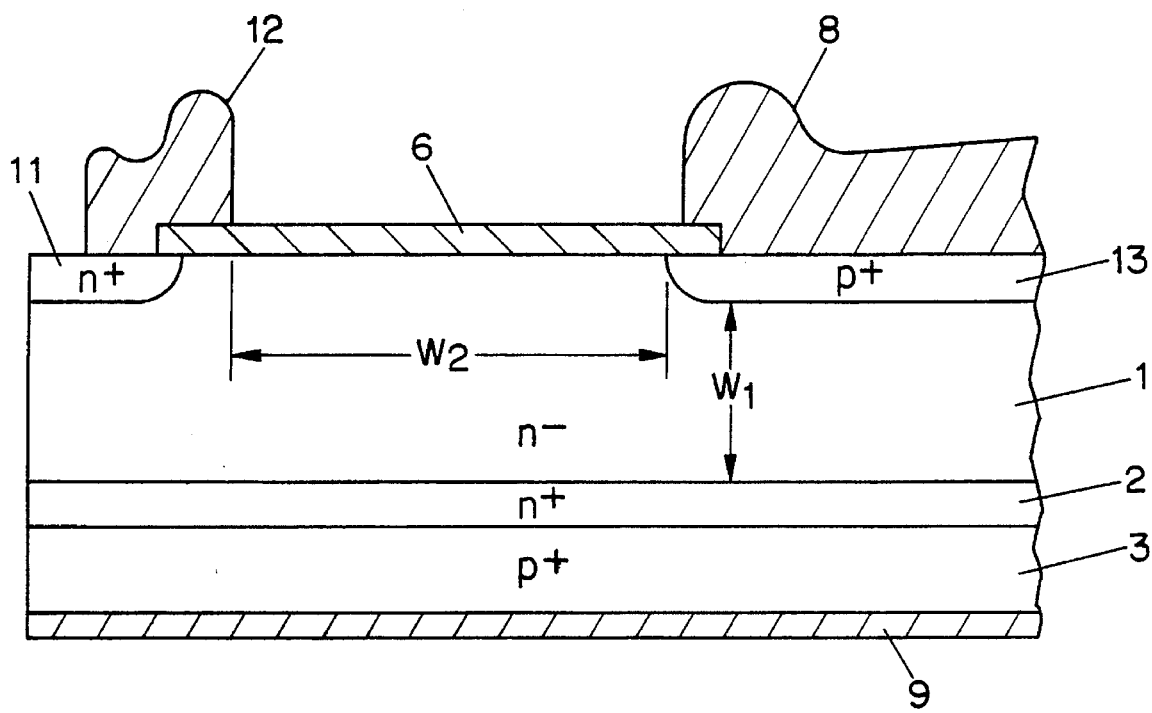
FIG. 1 is a cross-sectional view of an edge of a device according to a preferred first embodiment of the present invention.
Figure 2:
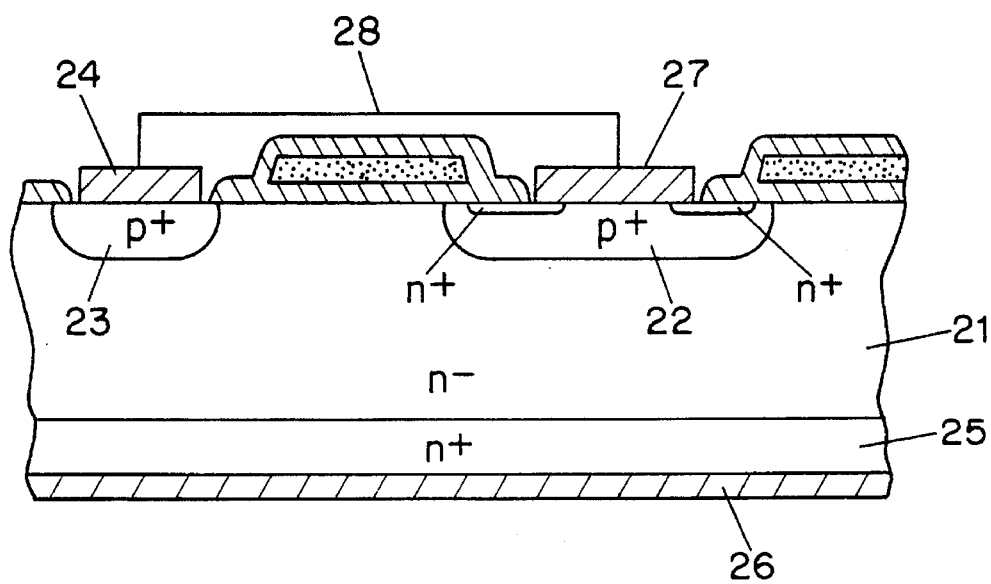
FIG. 2 is a cross-sectional view of an MOS device having a built-in, current-regenerative diode.
Figure 3:
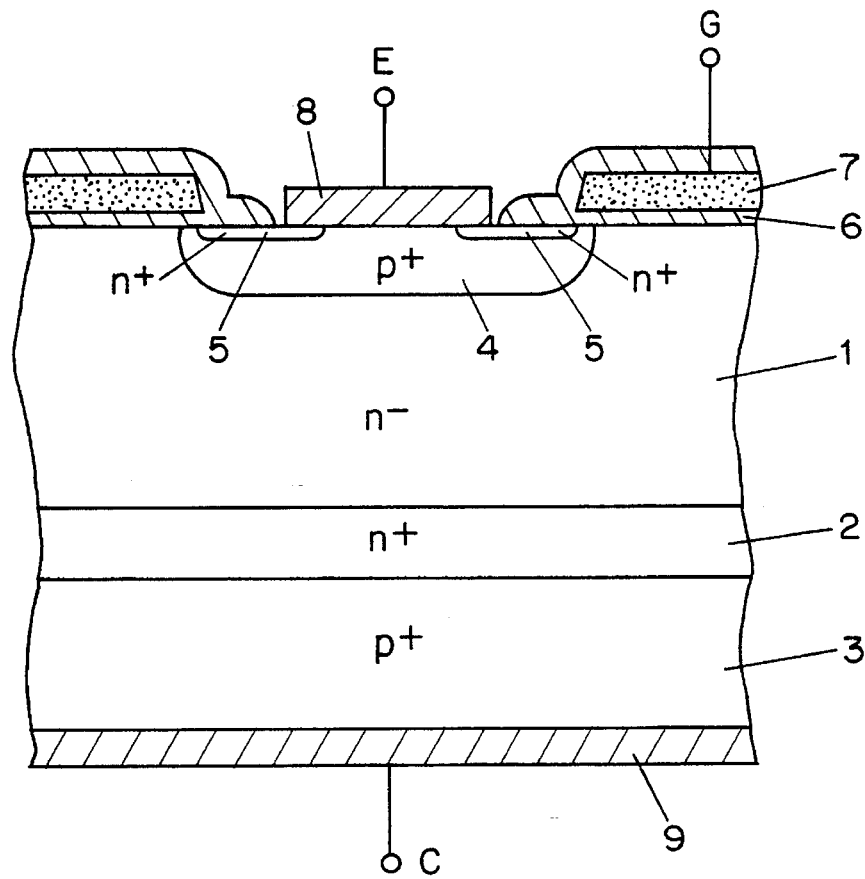
FIG. 3 is a cross-sectional view of an IGBT element.

FIG. 1 shows an $n^+$-region 11 formed by a diffusion process near the lateral edge of a semiconductor device, at the surface of a base layer 1. A $p^+$-region 13, laterally spaced from the region 11, is included as the anode region of a $p^+$-$n^-$-$n^+$ diode. The region 11 serves as the cathode region of the diode. The anode region 13 contacts a laterally-extending portion of an emitter electrode 8 of an IGBT, and the cathode region 11 contacts a cathode electrode 12 which in turn is coupled to a collector electrode 9. The surface of base layer 1 between the emitter electrode 8 and the cathode electrode 12 is covered with an insulating film 6. Further to the device portion of FIG. 1, this embodiment of the invention includes an IGBT structure as shown in FIG. 3 and as described above. The combined device structure is readily visualized as the planes of cross section of the structures of FIG. 1 and 3 are taken as mutually perpendicular, resulting in partial views in mutually perpendicular directions.

The breakdown voltage and the on-resistance of the resulting $p^+$-$n^-$-$n^+$ diode depend on the thickness $W_1$ of the region of the $n^-$ base layer 1 between the region 13 and the buffer layer 2, and also on the length $W_2$ of the region of the $n^-$ base layer 1 between the cathode 12 and the emitter electrode 8. Similarly, the thickness $W_1$ influences the breakdown voltage of the adjacent IGBT. The anode region 13 of FIG. 1 may be formed as an extension of the IGBT channel region 4 of FIG. 3.

Figure 7:
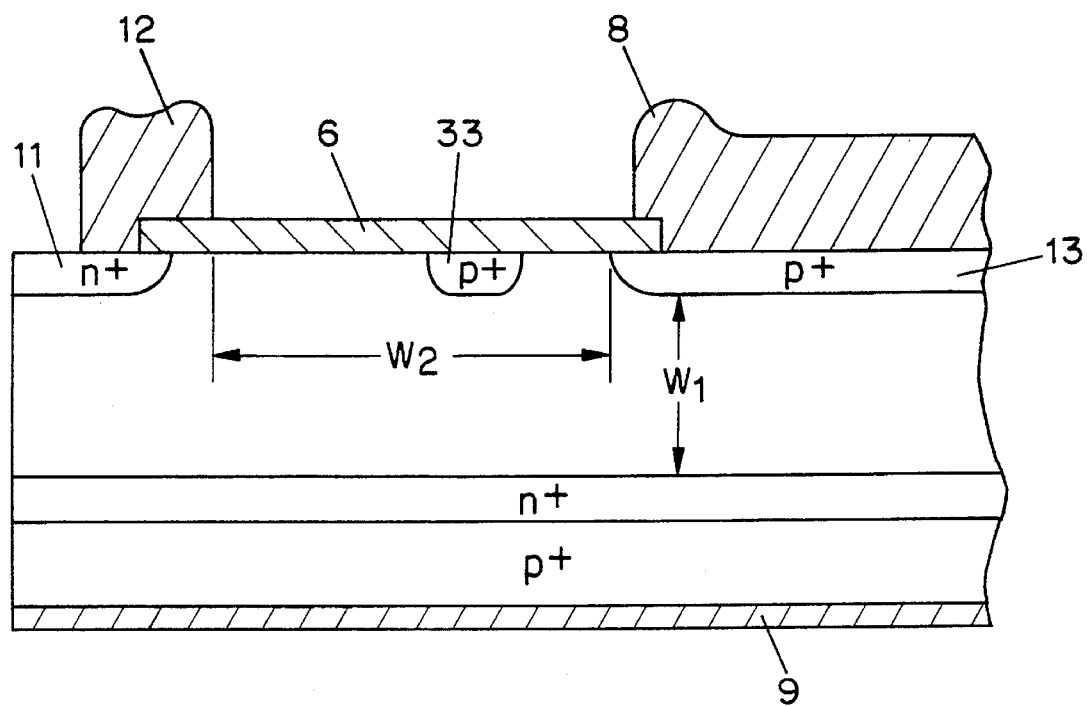
FIG. 7 is a cross-sectional view of an edge of a device according to a preferred second embodiment of the invention.

The cathode region 11 serves as a channel-stopper region or punch-through barrier for the IGBT element. Additionally, as shown in FIG. 7, a guard-ring region 33 may be disposed at the surface of the base layer, between the anode region 13 and the cathode region 11, influencing the breakdown voltage of the diode, and thereby permitting significantly greater packing density. The channel-stopper region prevents the expansion of the inversion layer generated in the surface portion of the base layer. As this channel-stopper region is of the same conductivity type as the base layer, it is more effective in raising the breakdown voltage of the IGBT element than a stopper region of the second conductivity type formed in a conventional IGBT structure.

Figure 4:
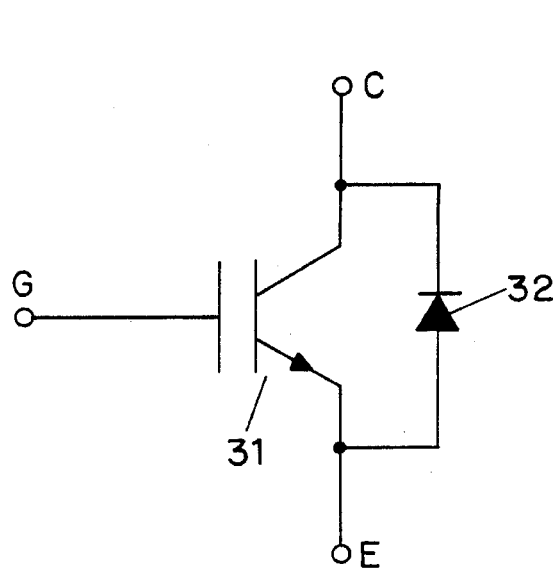
FIG. 4 is an equivalent-circuit diagram of a device having a current-regenerative diode connected to an IGBT.

The resulting $p^+$-$n^-$-$n^+$ diode, comprising the anode region 13, the base layer 1 and the cathode region 11, functions as a current-regenerative diode. Since the anode region 13 is connected to the emitter electrode, and the cathode region 11 to the collector electrode, the diode is connected in reverse parallel to the IGBT element. The equivalent circuit of FIG. 4 applies.

Figure 5:
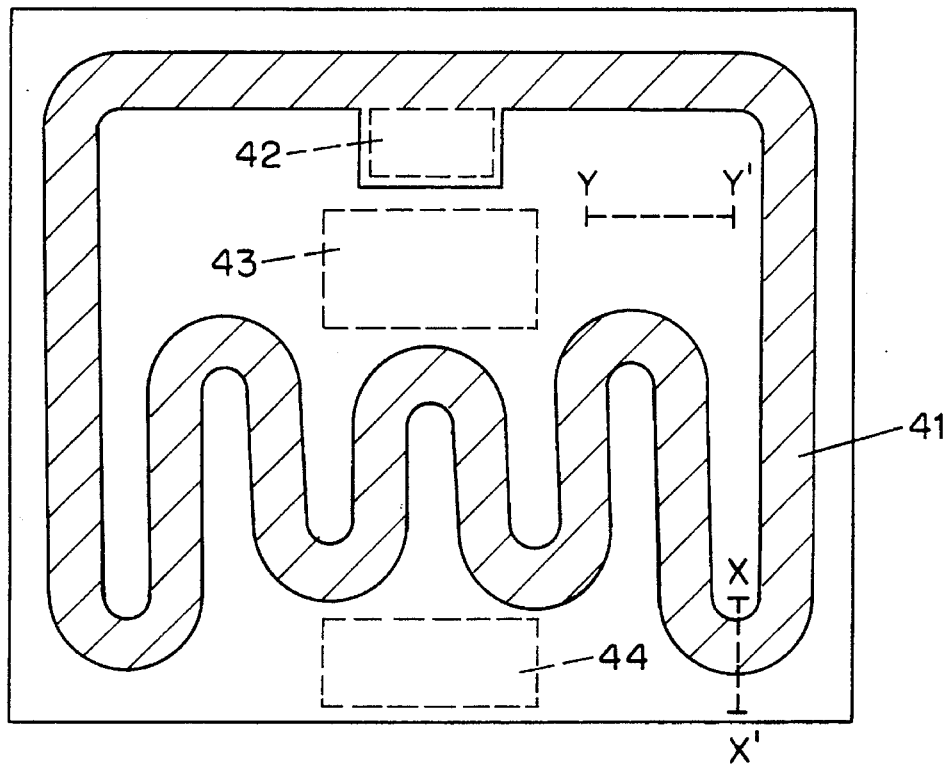
FIG. 5 is a plan view of the device of FIG. 1.

FIG. 5 is a plan view of the embodiment shown in FIG. 1. Region 41 is the punch-through barrier between the emitter electrode 8 and the cathode 12. A gate pad 42, an emitter pad 43 and a cathode pad 44 are disposed on the top surface of the chip 40.

Figure 6:
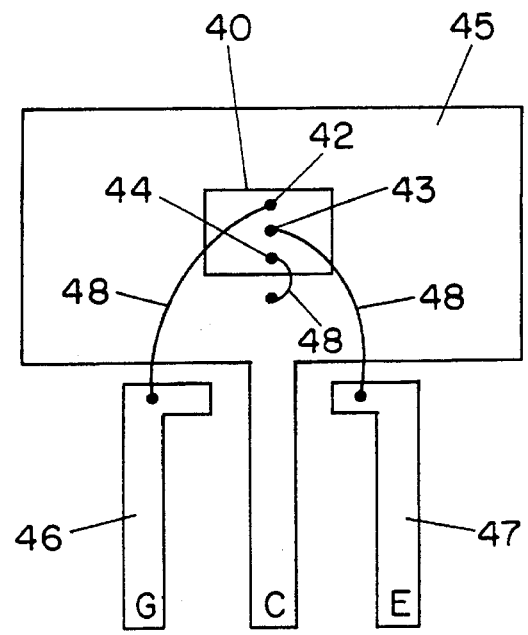
FIG. 6 is a plan view of the device of FIGS. 1 and 5, mounted on a support and connected to external leads.

FIG. 6 shows the chip 40 of FIG. 5, brazed onto a support 45 of a copper lead frame. The gate pad 42 and the emitter pad 43 are connected by conductors 48 to respective external leads 46 and 47. The cathode pad 44 is connected to the support 45.

FIG. 7 shows a $p^+$ guard-ring region 33 in the punch-through-barrier region of the base layer 1, formed along with the channel region 4 of FIG. 3 and the anode region 13 in the same diffusion process. With suitably chosen dimensions $W_1$ and $W_2$, and a suitable number of guard-ring regions 33, the resulting IGBT element may have a breakdown voltage greater than 1,000 V.

Figure 8:
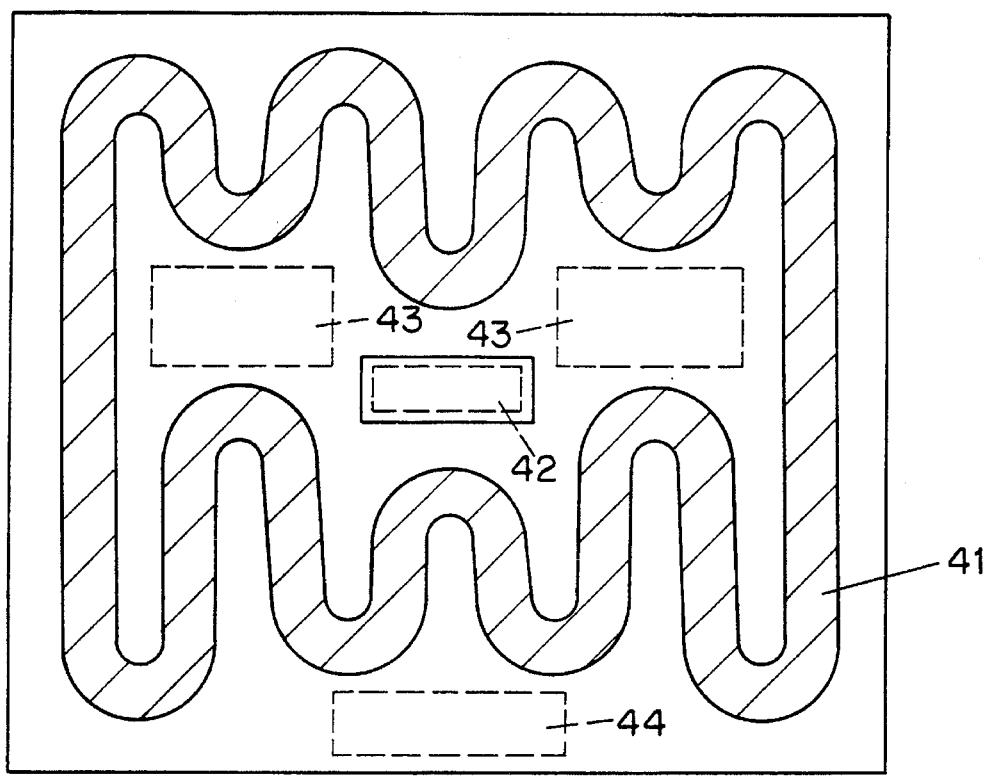
FIG. 8 is a plan view of the device of FIG. 7.

FIG. 8 shows an IGBT chip 40 with punch-through barrier 41, gate pad 42, two emitter pads 43 and cathode pad 44.

Figure 9:
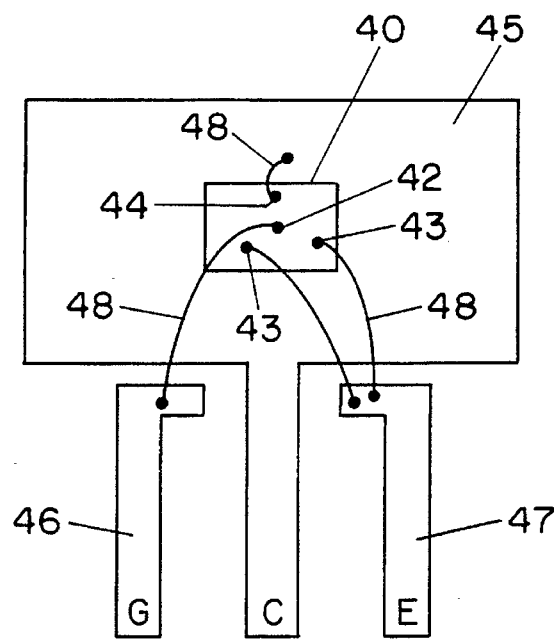
FIG. 9 is a plan view of the device of FIGS. 7 and 8, mounted on a support and connected to external leads.

FIG. 9 is analogous to FIG. 6 and shows the chip 40 of FIG. 8 affixed to a support 45 and connected to external leads 46 and 47.

FIGS. 10–13 relate to alternative embodiments of the invention for integrating a current-regenerative diode with an IGBT. Again, combined device structure is visualized by combining mutually perpendicular views of FIG. 3 on the one hand, and one of FIG. 10–13 on the other. The equivalent circuit of FIG. 4 applies also.

Figure 10:
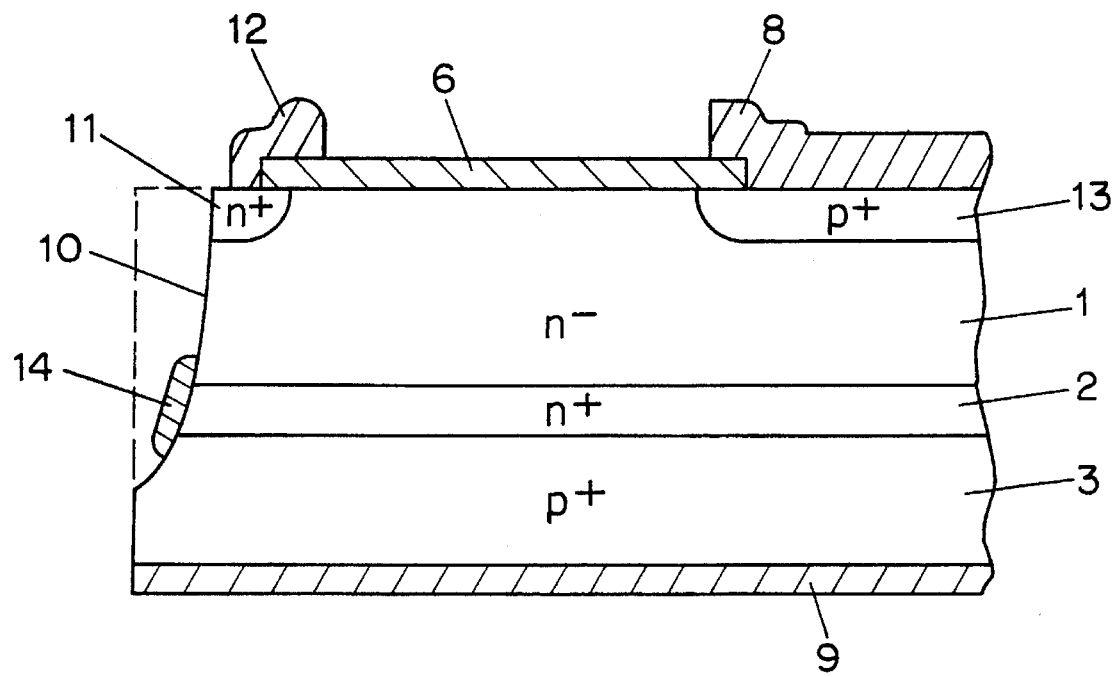
FIG. 10 is a cross-sectional view of an edge of a device according to a preferred third embodiment of the invention.

FIG. 10 shows an inclined face 10 of a mesa-shaped lateral edge of a semiconductor device. An $n^+$ channel-stopper region 11 is formed at the corner of the upper edge of the inclined face 10 and the top surface of the base layer 1. The channel-stopper electrode 12 is at the same potential as the collector electrode 9 and contacts the region 11. The $p^+$-region 13, formed simultaneously with the channel region 4 of FIG. 3, is laterally spaced from the channel-stopper region 11. The $p^+$-region 13 contacts a laterally extending portion of the emitter electrode 8. The surface portion of the $n^-$ base layer 1 between the channel-stopper electrode 12 and the emitter electrode 8 is covered with an insulating film 6. A short-circuit connection or electrode 14, which may be formed simultaneously with the emitter electrode 8 and the channel-stopper electrode 12, is on the inclined face 10 and contacts the $n^-$ base layer 1, the $n^+$ buffer layer 2 and the $p^+$ collector layer 3. The $p^+$-region 13, the $n^-$ base layer 1 and the $n^+$ buffer layer 2 form a $p^+$-$n^-$-$n^+$ diode. The emitter electrode 8 serves as an anode, and the electrode 14 serves as a cathode. Since the electrode 14 short-circuits the $n^+$-layer 2 and the collector layer 3, the diode is electrically connected with the collector electrode 9. As a result, this diode serves as a current-regenerative diode connected in reverse parallel with the emitter electrode 8 and the collector electrode 9 of the IGBT element. The $p^+$-region 13 may be formed contiguous with the channel region 4 of FIG. 3. Advantageously, as described, the electrode 14 is placed on an inclined face because, as a result, the contacted area of semiconductor layers 2 and 3 is increased as compared with placement on a vertical face. Alternatively, the contact area may include steps.

Figure 11:
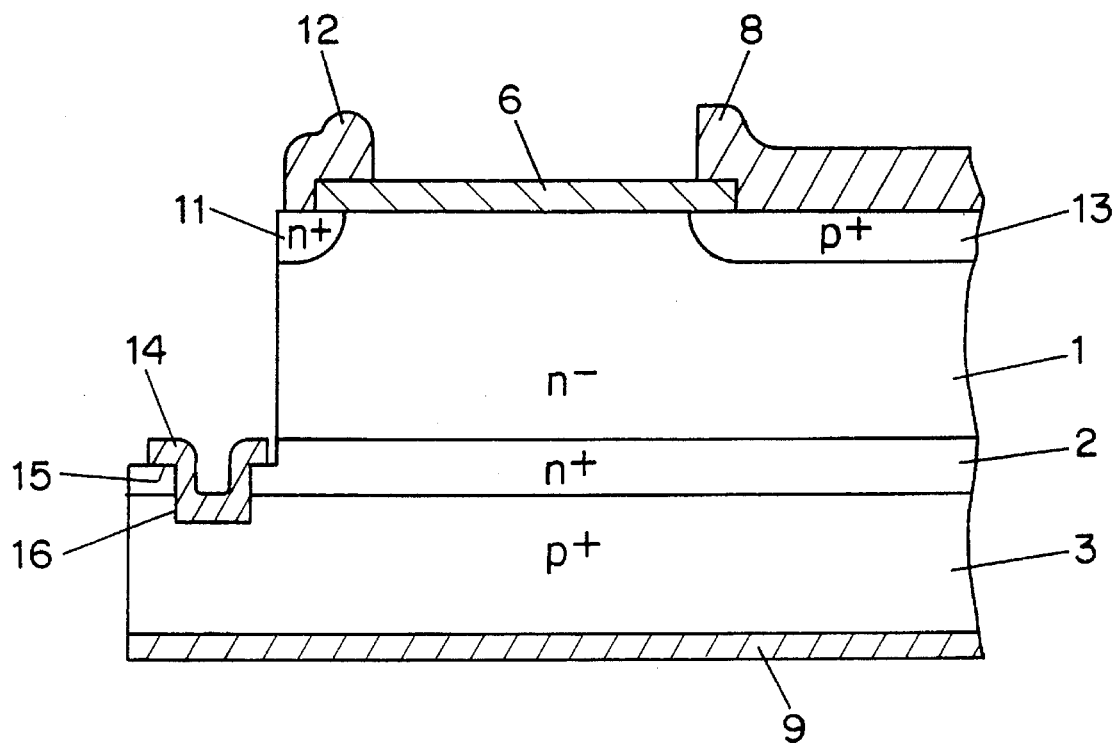
FIG. 11 is a cross-sectional view of an edge of a device according to a preferred fourth embodiment of the invention.

In the embodiment of FIG. 11, the edge of an IGBT chip is dry-etched to form a horizontal ledge face 15 at the edge of the $n^+$-layer 2, and a groove 16 is formed by dry-etching the ledge face 15. The electrode 14, which can be formed simultaneously with the emitter electrode 8 and the channel-stopper electrode 12, is on a portion of the ledge face 15 and the surface of the groove 16, thereby electrically connecting the $n^+$-layer 2 and the $p^+$-layer 3, and thereby connecting the diode in reverse parallel to the IGBT element.

Figure 12:
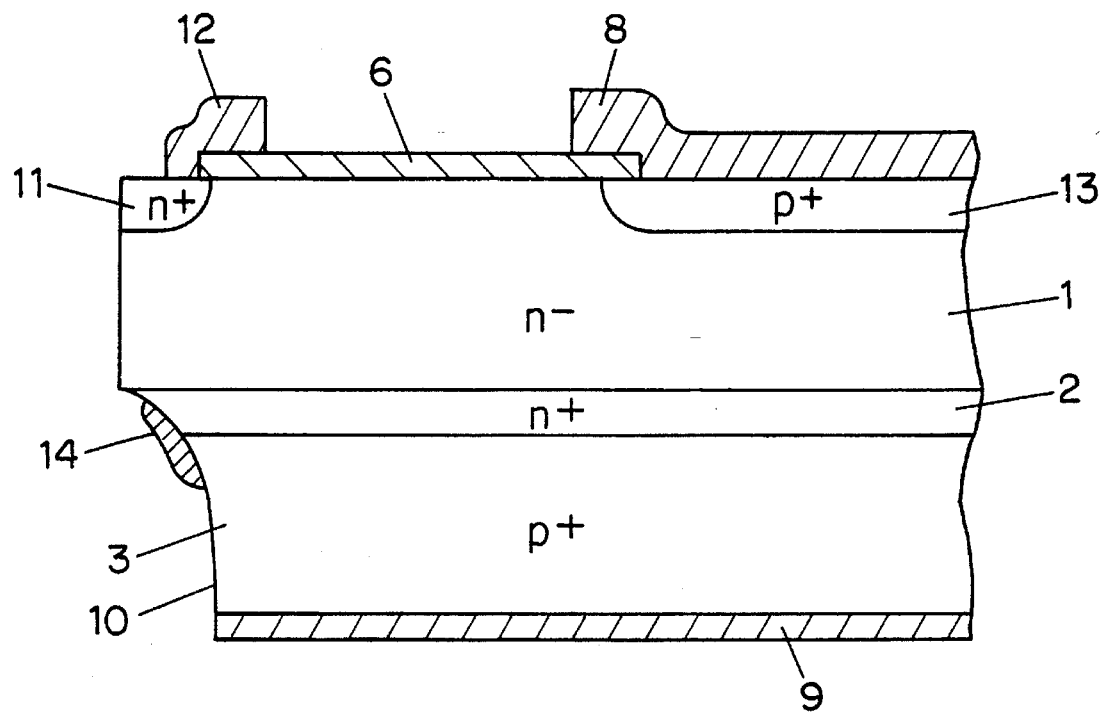
FIG. 12 is a cross-sectional view of an edge of a device according to a preferred fifth embodiment of the invention.

In the embodiment of FIG. 12, the inclined face 10 is formed by etching from the $p^+$ collector-layer side. The electrode 14, which may be formed simultaneously with the collector electrode 9, is formed on the inclined face 10 and short-circuits the $n^+$-layer 2 and the $p^+$-layer 3, thereby connecting the diode in reverse parallel to the IGBT element.

Figure 13:
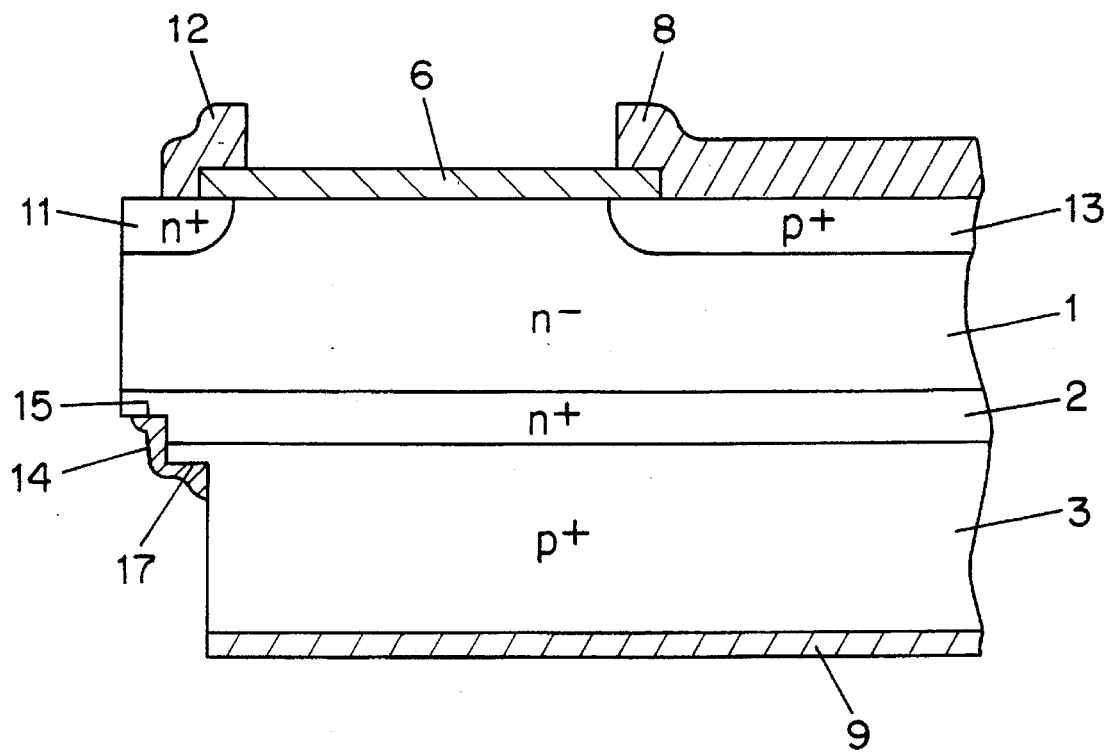
FIG. 13 is a cross-sectional view of an edge of a device according to a preferred sixth embodiment of the invention.

In the embodiment of FIG. 13, horizontal faces 15 and 17 are formed in the $n^+$-layer 2 and the $p^+$-layer 3, respectively, by etching from the $p^+$-layer side of the device. The electrode 14 short-circuits the $n^+$-layer 2 and the $p^+$-layer 3, thereby connecting the diode in reverse parallel to the IGBT element.

As described, the embodiments of FIG. 10–13 include an electrode to short-circuit an internal diode with the collector layer of the IGBT element, so that the diode serves as a current-regenerative diode connected in reverse parallel to the IGBT element. Advantageously, as a result of such arrangement, device packing density can be increased significantly, without impairment of the characteristics of the IGBT element. In all of the embodiments, a current-regenerative diode is integrated with an IGBT element on one and the same chip, and such a chip can be fabricated by conventional processing. As a result of integration, manufacturing costs are reduced.

While the above description is for an n-channel IGBT, a person skilled in the art will readily adapt the teaching to a p-channel IGBT.

I claim:

1. A semiconductor device including an insulated-gate bipolar transistor and a current-regenerative diode, comprising:

a first layer of first conductivity type having first and second surfaces;

a first region of second conductivity type selectively formed at the first surface of the first layer;

a second region of first conductivity type selectively formed in a first surface portion of the first region;

a third region of second conductivity type formed at the first surface of the first layer, laterally extending from and connected to the first region;

a second layer of first conductivity type having a first surface on the second surface of the first layer, the second layer having a higher impurity concentration than an impurity concentration of the first layer;

a third layer of second conductivity type disposed on a second surface of the second layer;

a gate electrode on a gate-insulating film on a second surface portion of the first region;

a first electrode contacting both the first region and the second region;

a collector electrode contacting the third layer;

a second electrode contacting at least the second layer and the third layer.

2. A semiconductor device according to claim 1, wherein the second electrode is formed on an inclined side surface of the device, said second electrode contacting the second and third layers at the inclined side surface of the device.

3. A semiconductor device according to claim 1, wherein the second electrode is formed at a peripheral edge of the device in a vertical groove having as its vertical walls portions of the second and third layers.

4. A semiconductor device including an insulated-gate bipolar transistor and a current-regenerative diode, comprising:

a base layer region of first conductivity type having first and second surfaces;

a channel region of second conductivity type at the first surface of the base layer region;

an emitter region of first conductivity type at a first surface of a first portion of the channel region;

a buffer layer region of first conductivity type disposed on the second surface of the base layer region, said buffer layer region having a substantially uniform thickness;

a collector layer region of second conductivity type disposed on the buffer layer region;

a gate electrode on a gate-insulating film on a first surface of a second portion of the channel region;

a first electrode contacting both the channel region and the emitter region;

a collector electrode contacting the collector layer region;

a first region of second conductivity type at the first surface of the base layer region formed away from the edge of the semiconductor device, the first region being in contact with the first electrode and being formed as an extension of the channel region;

a second region of first conductivity type at the first surface of the base layer region formed near the edge of the semiconductor device, the second region having a lower specific resistance than the base layer region;

a second electrode in contact with the second region, the second electrode being connected with the collector electrode; and a guard-ring region of the second conductivity type disposed at the first surface of the base layer region between the first region and the second region.

* * * * *